(12) United States Patent
Kashyap et al.

(10) Patent No.: US 11,818,810 B2
(45) Date of Patent: Nov. 14, 2023

(54) HEATER ASSEMBLY WITH PURGE GAP CONTROL AND TEMPERATURE UNIFORMITY FOR BATCH PROCESSING CHAMBERS

(71) Applicant: Applied Materials, Inc., Santa Clara, CA (US)

(72) Inventors: Dhritiman Subha Kashyap, Bangalore (IN); Amit Rajendra Sherekar, Bangalore (IN); Kartik Shah, Saratoga, CA (US); Ashutosh Agarwal, San Jose, CA (US); Eric J. Hoffmann, San Francisco, CA (US); Sanjeev Baluja, Campbell, CA (US); Vijay D. Parkhe, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 264 days.

(21) Appl. No.: 17/214,340

(22) Filed: Mar. 26, 2021

(65) Prior Publication Data
US 2022/0312553 A1    Sep. 29, 2022

(51) Int. Cl.
*H05B 1/02*    (2006.01)
*H01L 21/67*    (2006.01)

(52) U.S. Cl.
CPC ...... *H05B 1/0233* (2013.01); *H01L 21/67103* (2013.01)

(58) Field of Classification Search
CPC ......... H01L 21/67103; H01L 21/67126; H01L 21/6831; H01L 21/68735; H01L 21/68764; H01L 21/68771; H01L 21/68792; H05B 1/0233; H05B 3/28

USPC ....................................................... 219/444.1
See application file for complete search history.

(56) References Cited

U.S. PATENT DOCUMENTS

| 5,960,555 | A | 10/1999 | Deaton et al. |
| 7,806,983 | B2 | 10/2010 | Chiang et al. |
| 2002/0069820 | A1 | 6/2002 | Yudovsky |
| 2006/0207509 | A1* | 9/2006 | Tomita .............. H01L 21/67017 118/728 |
| 2010/0139556 | A1* | 6/2010 | Kagami ............ C23C 16/45519 118/58 |
| 2013/0284374 | A1* | 10/2013 | Lubomirsky ..... H01L 21/67103 361/234 |
| 2019/0080889 | A1* | 3/2019 | Ghosh ............... H01J 37/32495 |
| 2019/0203350 | A1 | 7/2019 | Khaja et al. |
| 2021/0087681 | A1 | 3/2021 | Aubuchon et al. |

FOREIGN PATENT DOCUMENTS

| KR | 20200142601 A | 12/2020 |
| WO | 202092184 A1 | 5/2020 |

OTHER PUBLICATIONS

PCT International Search Report and Written Opinion in PCT/US2022/021891 dated Jul. 21, 2022, 10 pages.

* cited by examiner

*Primary Examiner* — Sang Y Paik
(74) *Attorney, Agent, or Firm* — Servilla Whitney LLC (57) ABSTRACT

A heater assembly having a backside purge gap formed between a top plate and a heater of the heater assembly, the top plate having a top plate wall. The top plate wall having an upper portion, a middle portion and a lower portion, the middle portion forming an incline relative to the top portion.

8 Claims, 10 Drawing Sheets

HEATER ASSEMBLY WITH PURGE GAP CONTROL AND TEMPERATURE UNIFORMITY FOR BATCH PROCESSING CHAMBERS

TECHNICAL FIELD

Embodiments of the disclosure generally relate to heater assemblies for batch processing chambers. In particular, embodiments of the disclosure are directed to heater assemblies with better thermal control and decreased backside deposition.

BACKGROUND

In some chamber designs for atomic layer deposition (ALD) or chemical vapor deposition (CVD) processing, precursors and gases are delivered to a large substrate support or multiple substrate support surfaces through multiple gas distribution plates at the same time. The gas distribution plates are spaced from the substrate surfaces, or vice versa, forming one or more operational gaps. Such chambers can be highly sensitive to the consistency and uniformity of the gaps between different process stations and over time as the chamber is used. Furthermore, during processing, the temperature of the wafer is brought up to processing temperatures above 600° C. to 1200° C. Deposition can be highly sensitive to the consistency and uniformity of the temperature across the wafer, where a small temperature differential benefits uniformity.

In some chamber designs, the wafer is supported by a substrate support and various purge gaps exist within such designs to exhaust precursors and gases which have flown over a peripheral edge of the substrate support. One such purge gap exists between a substrate support and a heater ring. Exhaust gases are pushed through the purge gap which can exhaust any remaining precursors or gases. However, existing designs for top plates and pedestal heaters allow process gases to effuse and build up as plaques on the back side of heaters. Further, due to incomplete coverage or inconsistencies in deposition, precursors or gases can enter the purge cap causing particle buildup on the backside of the wafer and within the purge gap, resulting in thickness variations of the wafer and corrosion and deposit buildup of the components of the chamber. Such deposits can also flake off, causing contamination of the process chamber with particles which results in increased down time cleaning, and preventative maintenance.

Therefore, there is a need in the art for apparatus for controlling and precursor plaque buildup on processing chamber components and the thermal non-uniformity between the substrate supports and gas distribution assemblies.

SUMMARY

One or more embodiments of the disclosure are directed to heater assemblies comprising a heater and a top plate. The heater comprises a top surface, a bottom surface and a heater wall extending from the top surface to the bottom surface defining a thickness. The top plate has a top surface, a bottom surface defining a top thickness of the top plate. The top plate has at least one opening through the thickness to allow the heater to pass through the opening. The opening has a peripheral inner surface defining a top plate wall extending the thickness of the top plate. The top plate wall comprises an upper portion and a bottom portion. The bottom portion forms an angle Θ relative to the top portion.

Additional embodiments of the disclosure are directed to heater assemblies comprising a heater and a top plate. The heater comprises a top surface, a bottom surface and a heater wall extending from the top surface to the bottom surface defining a thickness. The top plate has a top surface, a bottom surface defining a top thickness of the top plate. The top plate has at least one opening through the thickness to allow the heater to pass through the opening. The opening has a peripheral inner surface defining a top plate wall extending the thickness of the top plate. The top plate wall comprises an upper portion and a bottom portion. The middle portion forms an angle Θ relative to the top portion.

Further embodiments of the disclosure are directed to heater assemblies comprising a heater and a top plate. The heater comprises a top surface, a bottom surface and a heater wall extending from the top surface to the bottom surface defining a thickness. The top plate has a top surface, a bottom surface defining a top thickness of the top plate. The top plate has at least one opening through the thickness to allow the heater to pass through the opening. The opening has a peripheral inner surface defining a top plate wall extending the thickness of the top plate. The top plate wall comprises an upper portion and a bottom portion. The bottom portion forms an angle Θ relative to the top portion. A shield plate has a top surface, a bottom surface and an outer peripheral edge. The shield plate has an opening extending from the top surface to the bottom surface in an inner portion. The heater standoff extends through the opening in the shield plate. The bottom surface of the heater is spaced a distance from the top surface of the shield plate. The shield plate has a top portion having a top surface in contact with the bottom surface of the top plate. The top portion has a total thickness $T_{SP}$ defined by the top surface of the top portion to the bottom surface. The top portion has a plurality of holes extending through the top portion to the outer peripheral edge. The top portion has a ring-shaped groove positioned a distance on the outer peripheral edge of the shield plate. A split ring is positioned within the groove of the shield plate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

Embodiments of the present disclosure provide pedestal heater and support assemblies with improved top plates and internal shielding to enable effective purging of the backside cavity. Some embodiments prevent heater purge leakage by improving thermal control at the O-ring location. In some embodiments, the gap between the top plate and the heater is improved to control temperature drop at the heater edge.

Some embodiments provide support assemblies with symmetric conductive and radiative boundary conditions for multiple (e.g., four) pedestal heaters. Some embodiments provide pedestal heaters with top plates that minimize azimuthal skew and edge heat loss. Some embodiments provide pedestal heater shields that effectively seal the heater purge cavity. One or more embodiments of the disclosed pedestal heater provides one or more of a low volume purge cavity, a streamlined flow to prevent dead zones and optimize flow recirculation by providing an angled top plate side wall or an extended shield with raised lip. Some embodiments advantageously allow for one or more of higher purge velocities, minimal or no flow recirculation inside the heater purge cavity, lower temperature drop at the heater edge or low temperature shielding for improved sealing.

One or more embodiment of the disclosure provides a heater pedestal with a top plate that surrounds the pedestal and a shield below the pedestal. In some embodiments, the shield and top plate form a cavity sealed by an O-ring. In some embodiments, the side wall of the top plate is inclined at an angle in a range of 20 degrees to 30 degrees away from the pedestal. In some embodiments, a lip on the top of the heater provides a small gap between the heater and top plate for the heater purge gas to flow out. In some embodiments, the top plate angle reduces the temperature difference along the wafer. In some embodiments, the top plate angle is in the range of 20 to 30 degrees.

In some embodiments, the shield has an extended portion below the top plate for increased heat loss to allow the shield temperature to be lower and/or to provide an effective sealing location. One or more embodiments provide ranges for improved plate lip height, side wall angle, shield lip height and width, shield extension length and/or shield-top plate gap. In some embodiments, increasing the distance between the top plate and the pedestal reduces thermal non-uniformity across the wafer. In some embodiments, increasing the backside purge gas pressure improves thermal non-uniformity along the wafer and pedestal.

Figure 1:
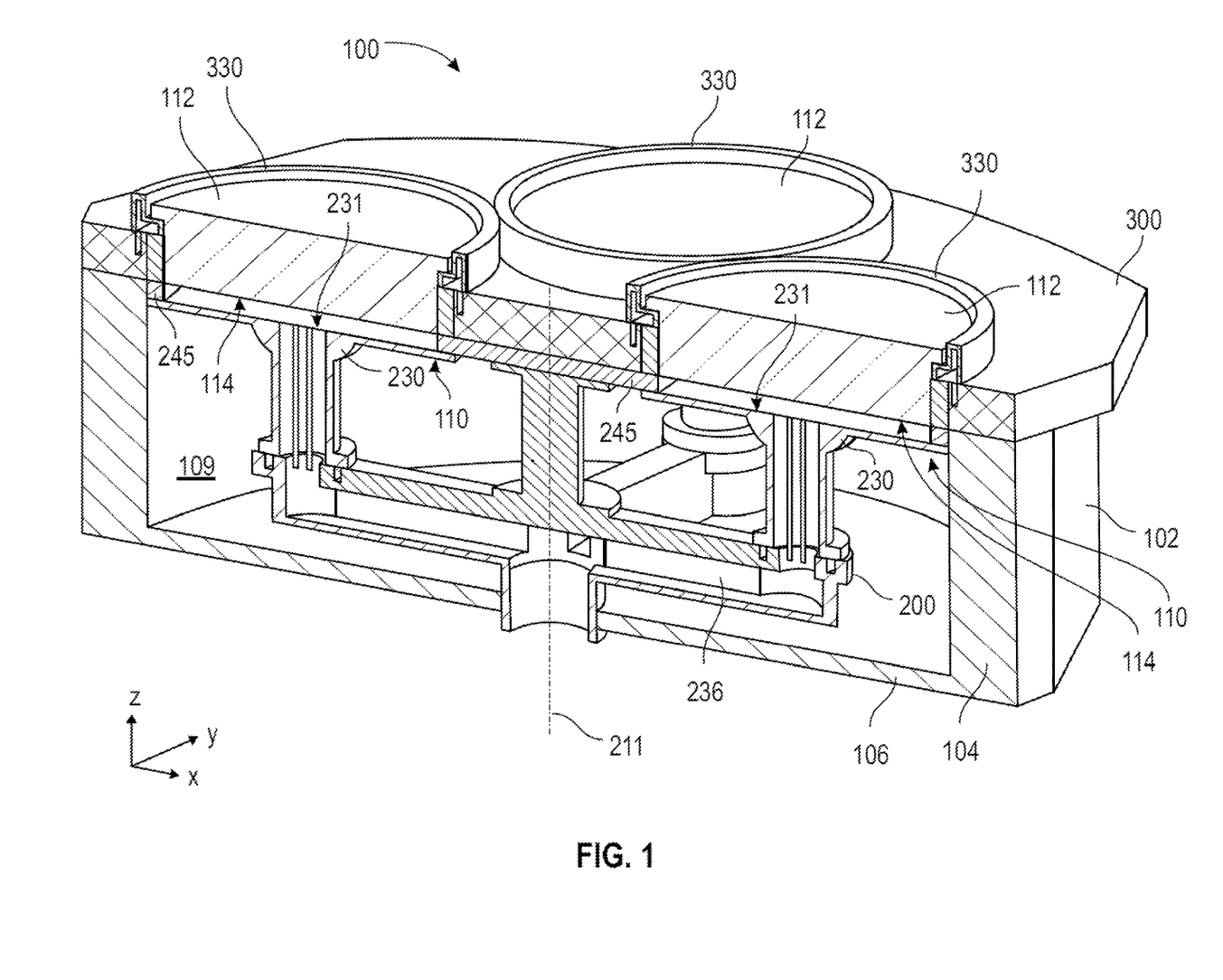
FIG. 1 shows a cross-sectional isometric view of a processing chamber in accordance with one or more embodiments of the disclosure.
Figure 2:
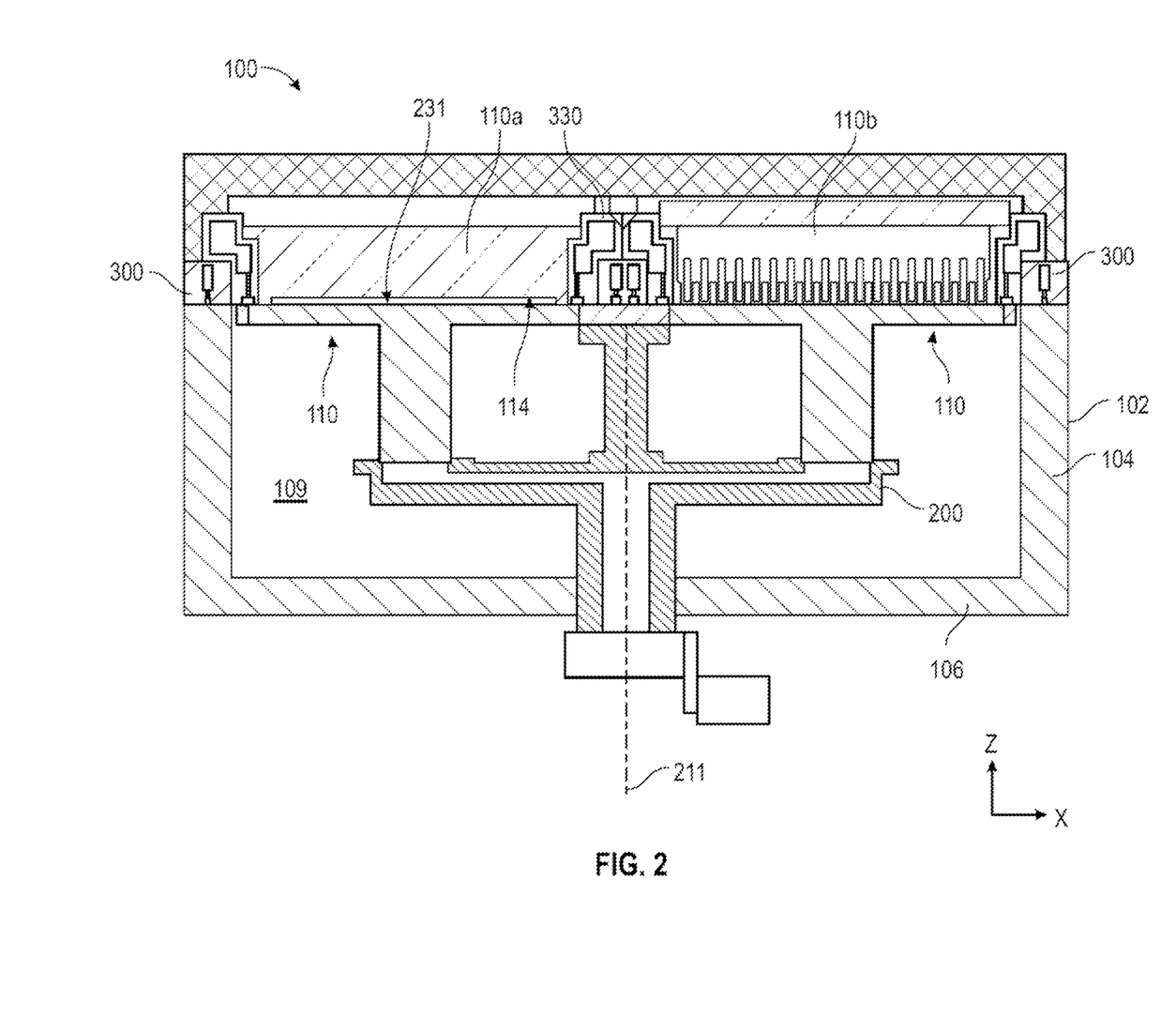
FIG. 2 shows a cross-sectional view of a processing chamber in accordance with one or more embodiments of the disclosure.
Figure 3:
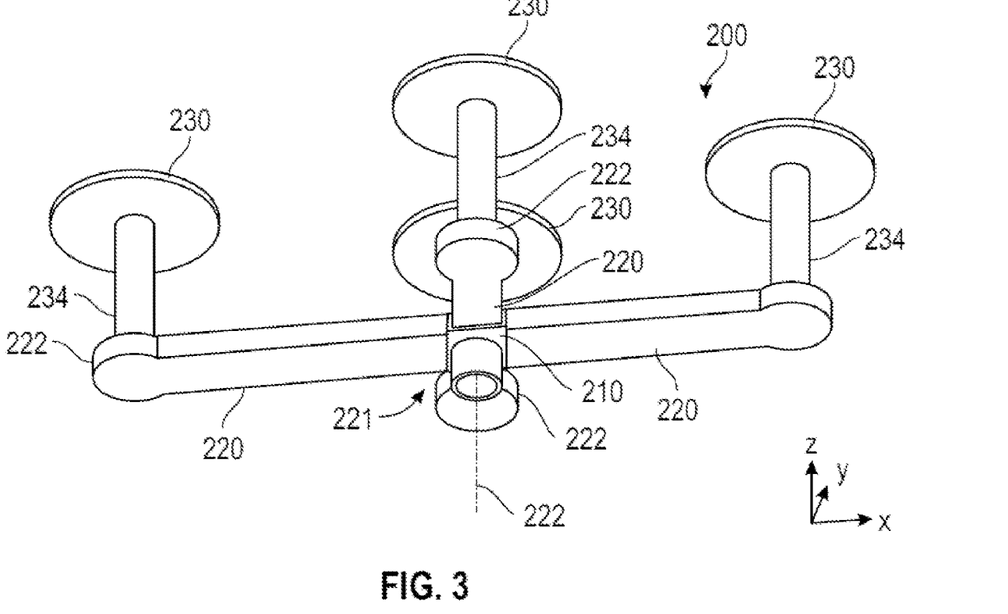
FIG. 3 shows a bottom perspective view of a support assembly in accordance with one or more embodiment of the disclosure.

The disclosure provides substrate supports for use with single substrate or multi-substrate (also referred to as batch) process chambers. FIGS. 1 and 2 illustrate a processing chamber 100 in accordance with one or more embodiment of the disclosure. FIG. 1 shows the processing chamber 100 illustrated as a cross-sectional isometric view in accordance with one or more embodiment of the disclosure. FIG. 2 shows a processing chamber 100 in cross-section according to one or more embodiment of the disclosure. FIGS. 3 through 6 illustrate support assemblies 200 in accordance with one or more embodiments of the disclosure.

The processing chamber 100 has a housing 102 with sidewalls 104 and a chamber floor 106. The housing 102 along with the chamber lid 300 define a processing volume, also referred to as an interior volume 109.

The processing station 110 illustrated comprises three main components: the chamber lid 300 (also called a lid), a pump/purge insert 330 and a gas injector 112. The processing chamber 100 further includes a plurality of processing stations 110. The processing stations 110 are located in the interior volume 109 of the housing 102 and are positioned in a circular arrangement around the rotational axis 211 of the substrate support 200. Each processing station 110 comprises a gas distribution plate 112 (also referred to as a gas injector) having a front surface 114. In some embodiments, the front surfaces 114 of each of the gas injectors 112 are substantially coplanar. The processing stations 110 are defined as a region in which processing can occur. For example, in some embodiments, a processing station 110 is defined as a region bounded by the support surface 231 of the substrate support 200, as described below, and the front surface 114 of the gas injectors 112. In the illustrated embodiment, heaters 230 act as the substrate support surfaces and form part of the substrate support 200. Each of the heaters 230 comprising the support surface 231 and a bottom surface 232 defining a thickness of the heaters 230. In some embodiments, the support surface 231 further includes provisions for at least three lift pins extending through the support surface 231

The processing stations 110 can be configured to perform any suitable process and provide any suitable process conditions. The type of gas distribution plate 112 used will depend on, for example, the type of process being performed and the type of showerhead or gas injector. For example, a processing station 110 configured to operate as an atomic layer deposition apparatus may have a showerhead or vortex type gas injector. Whereas a processing station 110 configured to operate as a plasma station may have one or more electrode and/or grounded plate configuration to generate a plasma while allowing a plasma gas to flow toward the substrate. The embodiment illustrated in FIG. 2 has a different type of processing station 110 on the left side (processing station 110a) of the drawing than on the right side (processing station 110b) of the drawing. Suitable processing stations 110 include, but are not limited to, thermal processing stations, microwave plasma, three-electrode CCP, ICP, parallel plate CCP, UV exposure, laser processing, pumping chambers, annealing stations and metrology stations.

Figure 4:
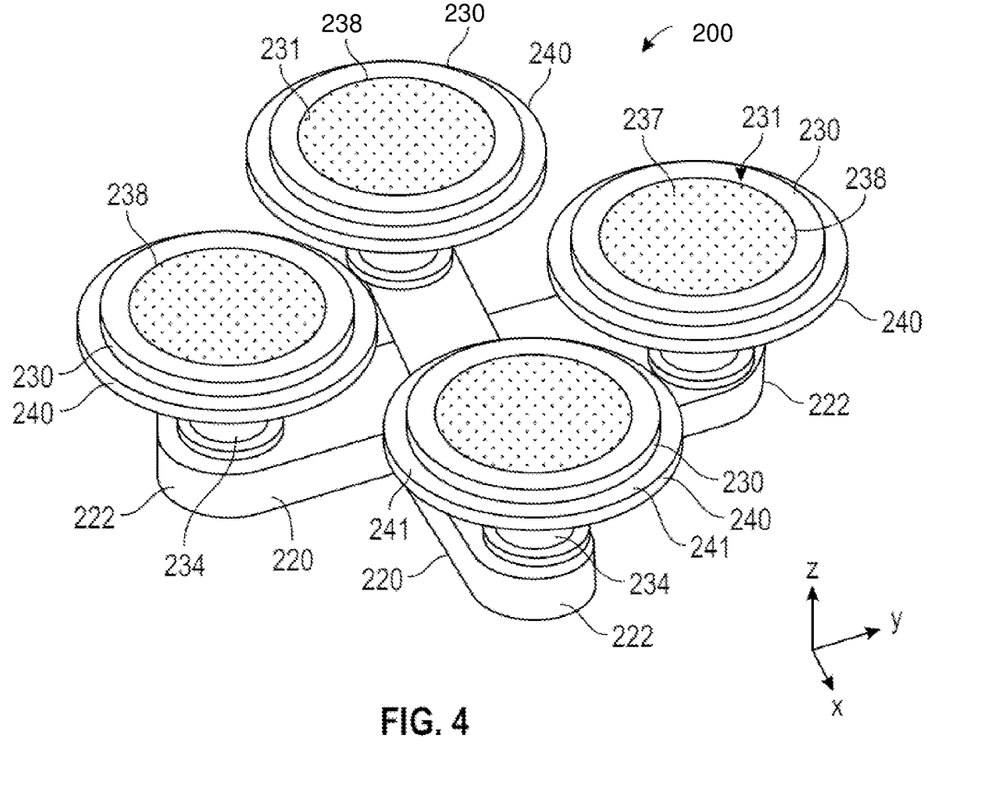
FIG. 4 shows a top perspective view of a support assembly in accordance with one or more embodiment of the disclosure.
Figure 5:
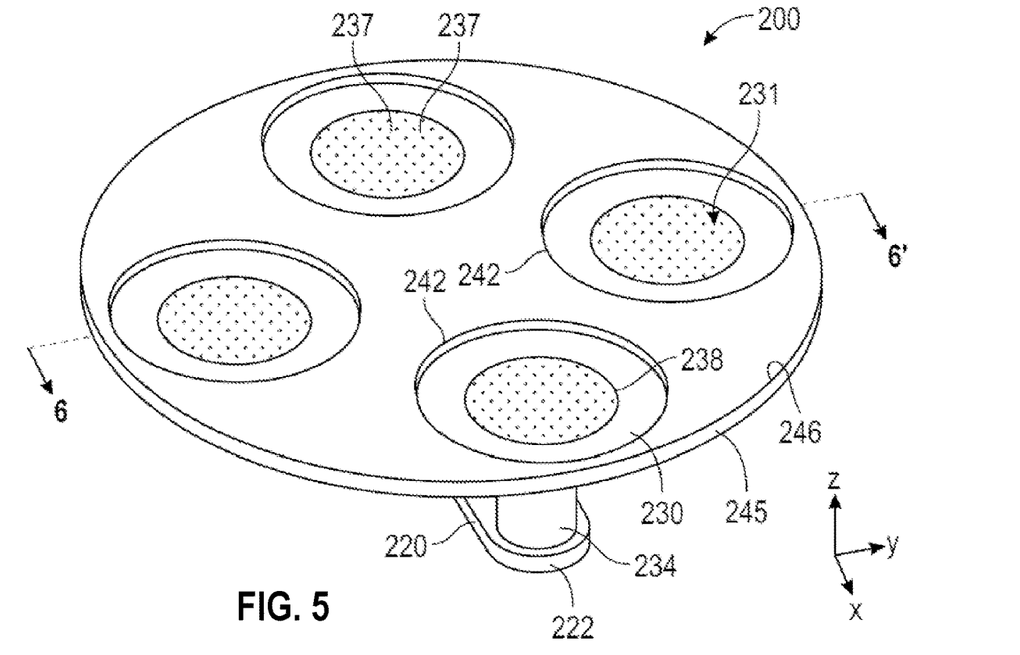
FIG. 5 shows a top perspective view of a support assembly in accordance with one or more embodiment of the disclosure.
Figure 6A:
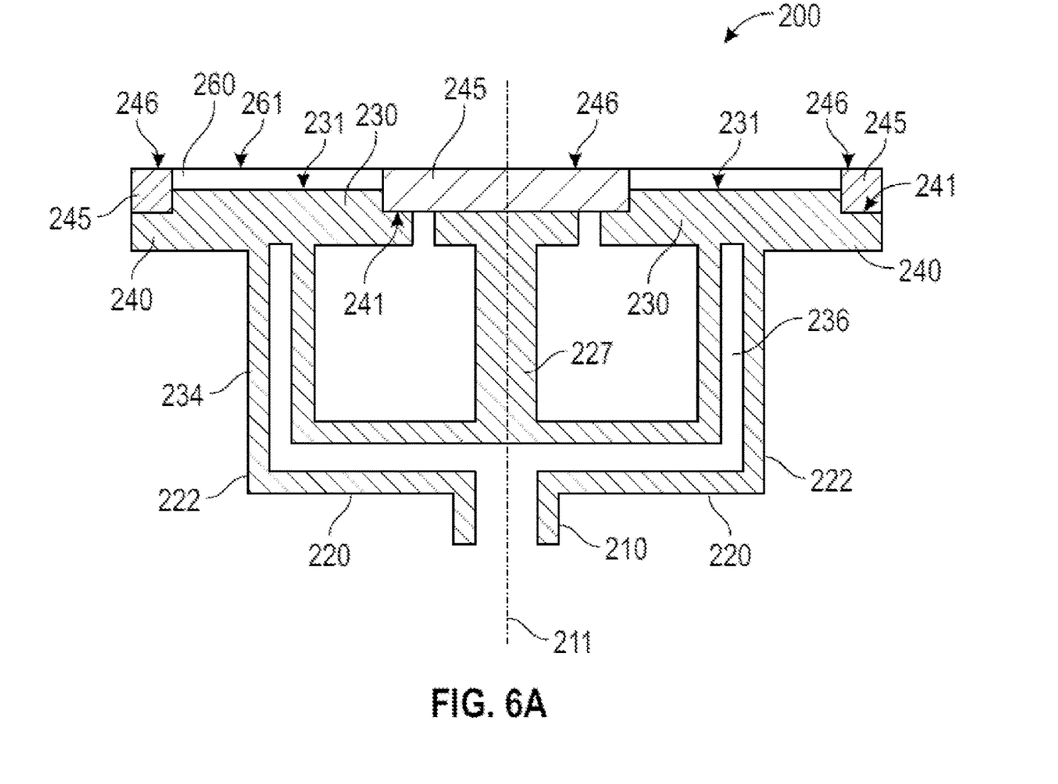
FIG. 6A shows a schematic cross-sectional view of a support assembly in accordance with one or more embodiment of the disclosure.
Figure 6B:
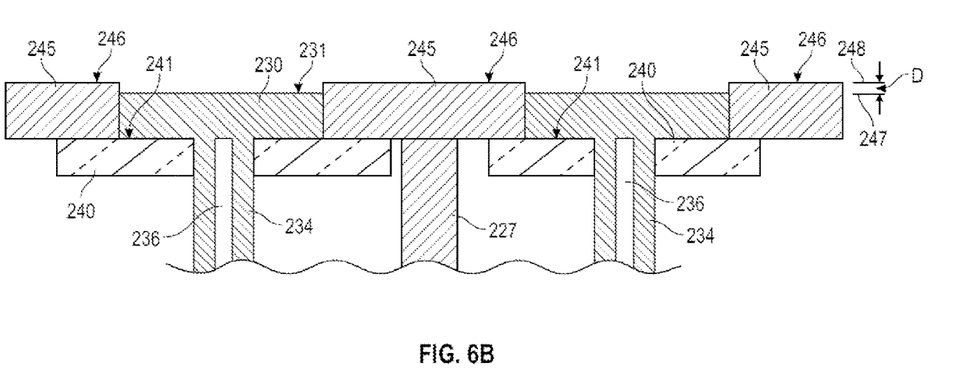
FIG. 6B shows a schematic cross-sectional view of a support assembly in accordance with one or more embodiment of the disclosure.

FIGS. 3 through 6 illustrate support assemblies 200 in accordance with one or more embodiments of the disclosure. The support assembly 200 includes a rotatable center base 210. The rotatable center base 210 can have a symmetrical or asymmetrical shape and defines a rotational axis 211. The rotational axis 211, as can be seen in FIG. 6, extends in a first direction. The first direction may be referred to as the vertical direction or along the z-axis; however, it will be understood that the use of the term "vertical" in this manner is not limited to a direction normal to the pull of gravity.

The support assembly 200 includes at least two support arms 220 connected to and extending from the center base 210. The support arms 220 have an inner end 221 and a heater mounting base 222. The inner end 221 is in contact with the center base 210 so that when the center base 210 rotates around the rotational axis 211, the support arms 220 rotate as well. The support arms 220 can be connected to the center base 210 at the inner end 221 by fasteners (e.g., bolts) or by being integrally formed with the center base 210.

In some embodiments, the support arms 220 extend orthogonal to the rotational axis 211 so that one of the inner ends 221 or heater mounting bases 222 are further from the rotational axis 211 than the other of the inner ends 221 and heater mounting bases 222 on the same support arm 220. In some embodiments, the inner end 221 of the support arm 220 is closer to the rotational axis 211 than the heater mounting base 222 of the same support arm 220.

The number of support arms 220 in the support assembly 200 can vary. In some embodiments, there are at least two support arms 220, at least three support arms 220, at least four support arms 220, or at least five support arms 220. In some embodiments, there are three support arms 220. In some embodiments, there are four support arms 220. In some embodiments, there are five support arms 220. In some embodiments, there are six support arms 220.

The support arms 220 can be arranged symmetrically around the center base 210. For example, in a support assembly 200 with four support arms 220, each of the support arms 220 are positioned at 90° intervals around the center base 210. In a support assembly 200 with three support arms 220, the support arms 220 are positioned at 120° intervals around the center base 210. Stated differently, in embodiments with four support arms 220, the support arms are arranged to provide four-fold symmetry around the rotation axis 211. In some embodiments, the support assembly 200 has n-number of support arms 220 and the n-number of support arms 220 are arranged to provide n-fold symmetry around the rotation axis 211.

A heater 230 is positioned at the heater mounting base 222 of the support arms 220. In some embodiments, each support arm 220 has a heater 230. The center of the heaters 230 are located at a distance from the rotational axis 211 so that upon rotation of the center base 210 the heaters 230 move in a circular path.

The heaters 230 have a support surface 231 which can support a substrate. In some embodiments, the heater 230 support surfaces 231 are substantially coplanar. As used in this manner, "substantially coplanar" means that the planes formed by the individual support surfaces 231 are within ±5°, ±4°, ±3°, ±2° or ±1° of the planes formed by the other support surfaces 231.

In some embodiments, the heaters 230 are positioned directly on the heater mounting base 222 of the support arms 220. In some embodiments, as illustrated in the drawings, the heaters 230 are elevated above the heater mounting base 222 of the support arms 220 by a heater standoff 234. The heater standoffs 234 have a substantially cylindrical body and can be any size and length to increase the height of the heaters 230.

In some embodiments, a channel 236 is formed in one or more of the center base 210, the support arms 220 and/or the heater standoffs 234. The channel 236 can be used to route electrical connections or to provide a gas flow.

The heaters can be any suitable type of heater known to the skilled artisan. In some embodiments, the heater is a resistive heater with one or more heating elements within a heater body.

In some embodiments, as shown in FIG. 4, the shield plates 240 are discoid shaped and are positioned around each heater 230. In the illustrated embodiment, the shield plates 240 are located below the heater 230 so that the top surface 241 of the shield plate 240 is below the support surface 231 of the heater.

The heaters 230 of some embodiments include additional components. For example, the heaters of some embodiments comprise electrostatic chucks. The electrostatic chuck can include various wires and electrodes so that a substrate positioned on the support surface 231 can be held in place while the heater is moved. This allows a substrate to be chucked onto a heater at the beginning of a process and remain in that same position on that same heater while moving to different process regions. In some embodiments, the wires and electrodes are routed through the channels 236 in the support arms 220. The electrostatic chuck is configured as a chucking surface disposed within the heater 230.

In some embodiments, as shown in FIG. 5, the top plate 245 is a single component that surrounds all of the heaters 230 with at least one opening 242 to allow access to the support surface 231 of the heaters 230. The top plate 245 has a top surface 246 and a bottom surface 249 defining a thickness of the top plate 245. The openings 242 can allow the heaters 230 to pass through the top plate 245. In some embodiments, the top plate 245 is fixed so that the top plate 245 moves vertically and rotates with the heaters 230.

Referring to FIG. 6A, in some embodiments, the top plate 245 has a top surface 246 forming a major plane 248 that is substantially parallel with a major plane 247 formed by the support surface 231 of the heater 230. In some embodiments, the top plate 245 has a top surface 246 forming a major plane 248 that is a distance D above the major plane 247 of the support surface 231. In some embodiments, the distance D is substantially equal to the thickness of a substrate 390 to be processed so that the support surface 231 is coplanar with the top surface 246 of the top plate 245, as shown in FIG. 6B. As used in this manner, the term "substantially coplanar" means that the major plane formed by the surface of the substrate 390 is within ±1 mm, ±0.5 mm, ±0.4 mm, ±0.3 mm, ±0.2 mm or ±0.1 mm of coplanarity.

Figure 7:
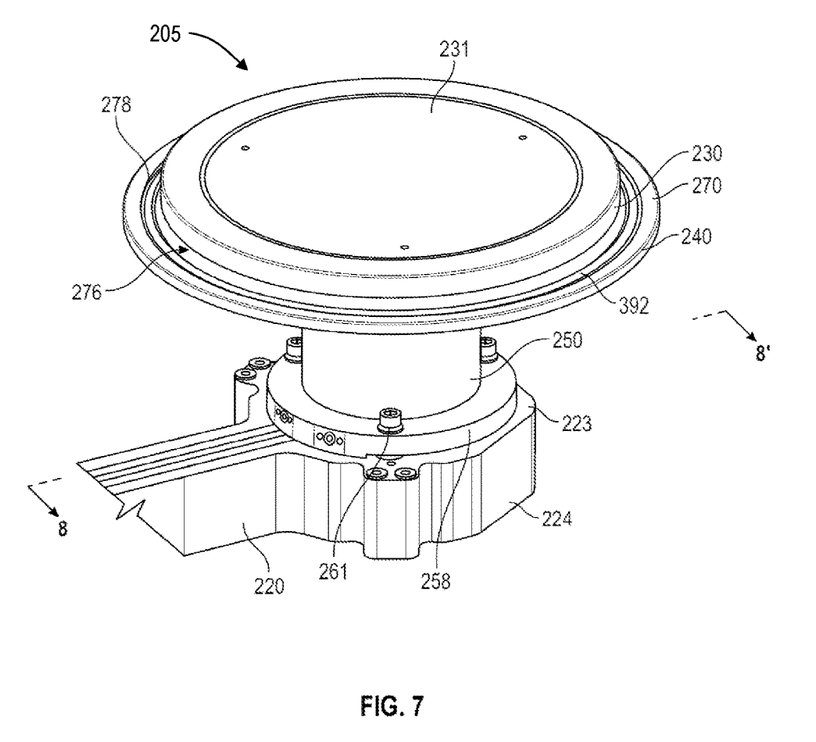
FIG. 7 shows a front perspective view of a heater assembly in accordance with one or more embodiment of the disclosure.
Figure 8:
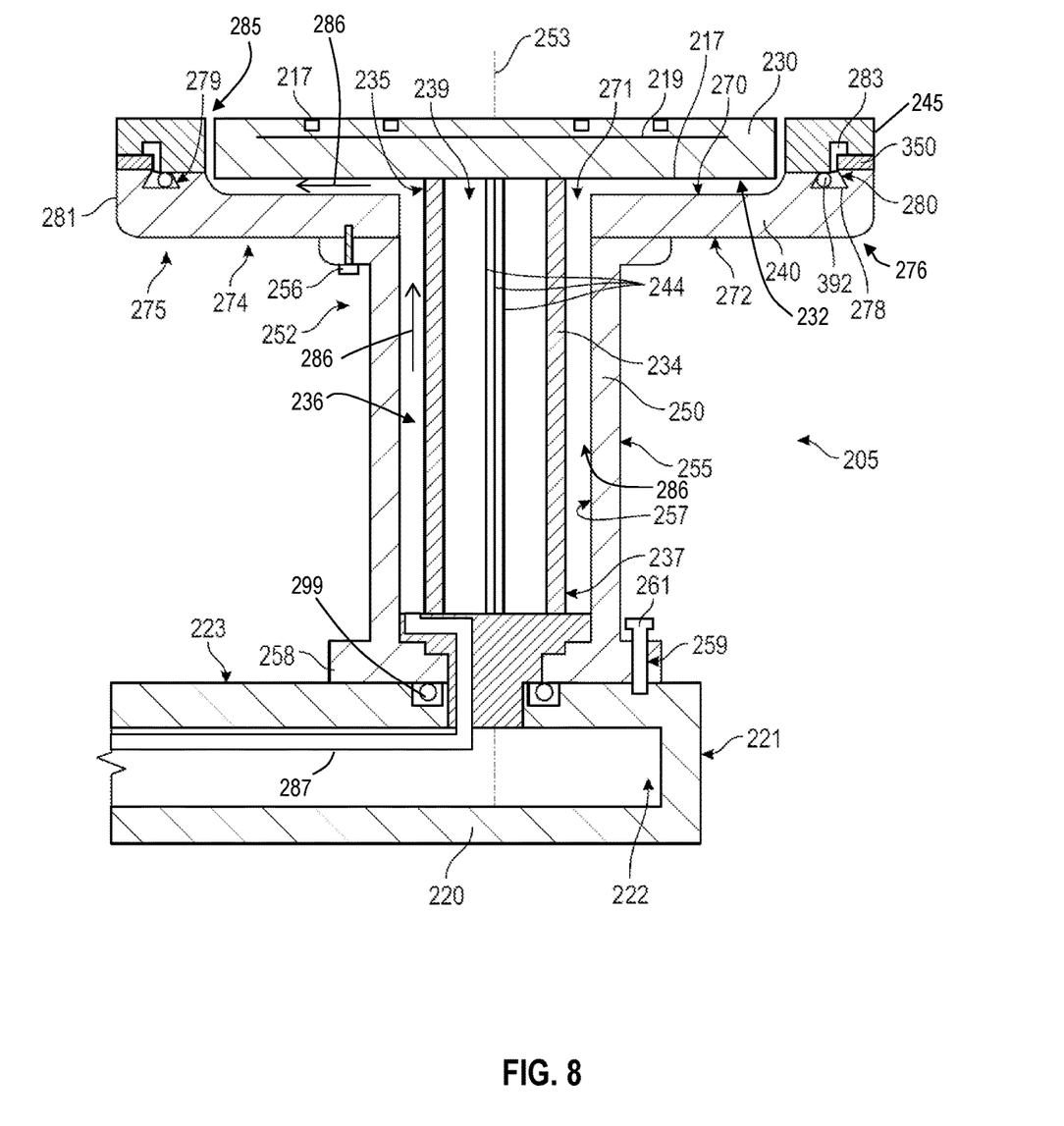
FIG. 8 shows a cross-sectional view of a heater assembly in accordance with one or more embodiments of the disclosure.

FIG. 7 shows an isometric view of a portion of a support assembly 200 with a heater assembly 205 in accordance with one or more embodiment of the disclosure. FIG. 8 shows a cross-sectional view of the portion of a support assembly 200 with the heater assembly 205 shown in FIG. 7, taken along line 8-8'. The shading in the Figures is used to aide in distinguishing the different components and does not imply any particular material of construction. In some embodiments, the heater assembly 205 comprises a heater 230, a heater standoff 234, and a shield made up of a shield shaft 250 and a shield plate 240.

The shield shaft 250 has an outside surface 255 and an inside surface 257 defining a wall thickness of the shield shaft 250. The inside surface 257 surrounds the heater standoff 234 and is spaced from the heater standoff 234 by a distance to form a purge gas channel 286. The shield shaft 250 has a top end 252 and a bottom end 258 defining a length of the shield shaft 250. The shield shaft 250 of some embodiments has a shape that is concentric with the shape of the standoffs 234. In some embodiments, the shield shaft 250 has a substantially cylindrical body. As used in this manner, the term "substantially cylindrical" means that shape gives the overall appearance of being cylindrical and includes elongate oval shapes. In some embodiments, at least one aperture 259 extends through the thickness of the bottom end 258, securing the bottom end 258 to the support arm 220 using any suitable fastener or weld.

The heater standoff 234 comprises a top end 235 and a bottom end 237. The top end 235 of the heater standoff 234 is in contact with the bottom surface 232 of the heater 230. In some embodiments, the heater standoff 234 has an open inner channel 239 to allow electrical connections 244 to one or more of a thermal element 219 or electrodes 217 of the electrostatic chuck within the heater 230. The skilled artisan will be familiar with the construction of heaters and electrostatic chucks and will appreciate that the arrangement of thermal and electrical components within the heater 230 can be varied.

In the illustrated embodiment, the top end 235 of the heater standoff 234 is above the top end 252 of the shield shaft 250. In some embodiments, the top end 252 of the shield shaft 250 extends above the top end 235 of the heater standoff 234. In some embodiments, the top end 252 of the shield shaft 250 extends to the top end 235 of the heater standoff 234.

Figure 9:
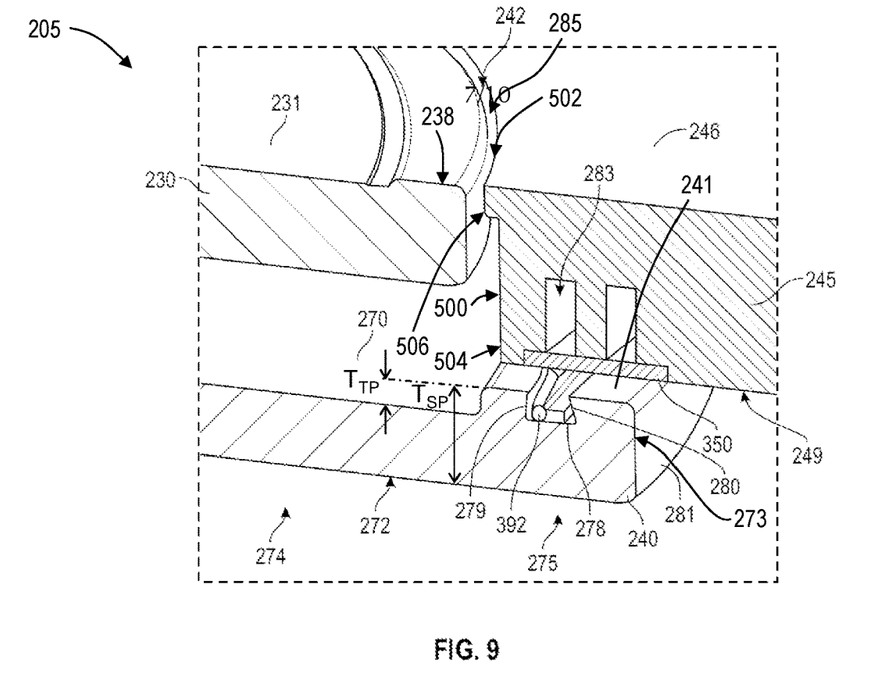
FIG. 9 shows a detailed cross-sectional view of a heater assembly in accordance with one or more embodiments of the disclosure.

As shown in FIGS. 8 and 9, the shield plate 240 has a top surface 270, a bottom surface 272 defining a thickness. The shield plate 240 further includes a top portion 273 having a top surface 241 in contact with the bottom surface 249 of the top plate 245. The top portion 273 has a total thickness $T_{SP}$ defined by the top surface 241 of the top portion 273 to the bottom surface 272. The top portion 273 essentially protrudes by a top portion thickness $T_{TP}$ defined by the top surface 241 of the top portion 273 to the top surface 270 of the shield plate 240.

The shield plate 240 further includes an opening 271 extending from the top surface 270 to the bottom surface 272. In some embodiments, as shown in the Figures, the bottom surface 232 of the heater 230 is spaced a distance from the top surface 270 of the shield plate 240. In some embodiments, the distance between the bottom surface 232 of the heater 230 and the top surface 270 of the shield plate 240 are spaced apart to form a gap. In some embodiments, the average gap is in the range of 1 mm to 15 mm, or in the range of 2 mm to 12.5 mm, or in the range 5 mm to 11 mm, or in the range of 8 mm to 10 mm.

The shield plate 240 has an inner portion 274, an outer portion 275 and an outer peripheral edge 281. In some embodiments, the outer portion 275 has a greater thickness than the thickness of the inner portion 274. In some embodiments, the bottom surface 272 of the shield plate 240 is in contact with the top end 252 of the shield shaft 250 and is secured with fasteners 256 extending through at least one aperture 254 that extend through the top end 252. In some embodiments, there are at least two apertures 254, or three apertures 254. In some embodiments, the bottom surface 272 is welded to the top end 252 of the shield shaft 250. In some embodiments, the bottom surface 272 of the shield plate 240 has a greater thickness where the top end 252 is in contact with the bottom surface 272 of the shield plate 240. In some embodiments, the greater thickness accommodates fastener holes configured to receive the fasteners 256.

FIG. 9 shows a portion of the outer edge of the heater 230 with top plate 245 and shield plate 240. In the illustrated embodiment, the shield plate 240 is positioned under at least one opening 242 of the top plate 245. The top surface 270 of the shield plate 240 further comprises a groove 278 with an inner face 279 and an outer face 280 extending around a peripheral portion 276 of the shield plate 240, the outer face 280 spaced a distance from an outer peripheral edge 281 of the shield plate 240. In some embodiments, the outer face 281 of the shield plate can coincide with the outer wall of the top plate 245. In other scenarios, radius of the outer face 281 can be up to 10 mm lower than the outer radius of the top plate. This is required to control heat transfer between the shield plate 240 and top plate 245. The top plate has active temperature control through cooling loop (shown as an inner plenum 283).

In some embodiments, the bottom surface 249 of the top plate 245 is in contact with the peripheral portion 276 of the top surface 270 of the shield plate 240. A first fluid seal 392 (also referred to as a "top fluid seal") is disposed within the ring-shaped groove 278 of the peripheral edge 281 to maintain low pressure conditions within the processing stations 110. The first fluid seal 392 is configured to non-uniformly compress around the periphery of the shield plate 240 such that, where uneven pressure is applied between the shield plate 240 and the top plate 245, the first fluid seal 392 still maintains predetermined conditions within the processing station.

In some embodiments, a ring-shaped shim 350 having a thickness is positioned between the top surface 241 of the shield plate 240 (which is below the support surface 231 of the heater 230) and the bottom surface 249 of the top plate 245. The ring-shaped shim 350 is configured to compress the first fluid seal 392 which is at least partially seated within the groove 278 of the shield plate 240. In some embodiments, the thickness of the ring-shaped shim 350 can be configured to accommodate for variable distances between the top surface 241 of the shield plate 240 and the bottom surface 249 of the top plate 245. In some embodiments, the ring-shaped shim 350 has a variable thickness around the periphery of the ring. In some embodiments, the ring-shaped shim 350 comprises a plurality of individual pieces assembled in a ring-shape.

In some embodiments, a plenum 283 is formed between the ring-shaped shim 350 and the top plate 245. The plenum 283 can be any suitable shape and/or size as will be understood by the skilled artisan. The purpose of the plenum is to have fluid flow at a particular temperature to actively control the temperature of the top plate. The plenum 283 of some embodiments is connected to a heat exchanger to ensure constant coolant temperature.

A second fluid seal 299 is disposed between the bottom end 258 and the top surface 223 of one of the support arms 220 to maintain low pressure conditions within the processing stations 110. The shield plate 240 and the shield shaft 250 form a uniform heater shield assembly. The heater shield assembly forms a uniform cavity sealed against leakage by the first fluid seal 392 and the second fluid seal 299, maintaining vacuum integrity within the uniform cavity. In some embodiments, both the ring-shaped shim 350 and the first fluid seal 392 are configured to seal against gas leakage into or out of the process station and maintain vacuum integrity in the process station and process chamber. The first fluid seal 392 and second fluid seal 299 can be any suitable compressible component known to the skilled artisan that is compatible with the process gases and process conditions.

Referring to FIGS. 8 through 12B, purge gas is expelled through a backside purge gap 285 formed between the heater 230 and the top plate 245. The backside purge gap 285 is essentially an outlet which surrounds the heater 230 through the opening 242 (as best shown in FIGS. 5 and 9). The purge gas is expelled through the backside purge gap 285 at a constant or variable pressure. In particular, in some embodiments, the purge gas is expelled through the backside purge gap 285 at a streamlined flow to prevent dead zones or eddies in the flow.

Purge gas is pushed through the backside purge gap 285 from a purge gas channel 286. For purposes of illustration, the purge gas channel 286 is illustrated with arrows showing the flow path of purge gas. In particular, the purge gas channel 286 is defined by a gas channel 287 within the support arm 220 and through the channel 236 formed between the in one or more of the center base 210 and between the bottom surface 232 of heater 230 and the top surface 241 of the shield plate 240. As shown, the channel 236 is in fluid communication with the purge gas channel 286.

Backside purge gaps 285 of conventional support assemblies and heaters have dead zones or geometric limitations which contribute to azimuthal skew and edge heat loss. FIGS. 9 through 15 illustrate embodiments of backside purge gaps 285 formed between the heater 230 and the top plate 245. In particular, each backside purge gap 285 is formed by a heater wall 233 of the heater 230 and a top plate wall 500 of the top plate 245.

The heater wall 233 is formed between the bottom surface 232 of the heater 230 and a top surface 238 of the heater 230 and extends the thickness of the heater 230. In some embodiments, the edge formed between the heater wall 233 and the top surface 238 is rounded or chamfered. In some embodiments, the edge formed between the heater wall 233 and the bottom surface 232 is rounded or chamfered. In the depicted figures, the heater wall 233 is at a right angle relative to the bottom surface 232 and top surface 238 of the heater 230. In some embodiments however, the heater wall 233 is angled relative to the bottom surface 232 other than a right angle.

The top plate wall 500 is the peripheral inner surface of the opening 242 in the top plate 245 formed between the top surface 246 of the top plate 245 and the bottom surface 249 of the top plate 245 and extends the thickness of the top plate 245. In some embodiments, the edge formed between the top plate wall 500 and the top surface 246 is rounded or chamfered. In some embodiments, the edge formed between the top plate wall 500 and the bottom surface 249 is rounded or chamfered.

As shown in FIG. 9, the top plate wall 500 is at a right angle relative to the bottom surface 249. The top plate wall 500 comprises a top portion 502 and a bottom portion 504, the top portion 502 being defined by a lip 506 extending from the top plate wall 500 toward the central axis 253 (as shown in FIG. 8). In some embodiments, the lip 506 extends from the top surface 246 of the top plate 245 to a distance from the top surface 246 along the top plate wall 500. In some embodiments, the edges of the lip 506 are chamfered. Further embodiments of top plate walls 500 having various geometric configurations (as illustrated in further detail below) which offer significant improvements from the top plate wall 500 having the lip 506 (as shown in FIG. 9) or a top plate wall 500 not having a lip (as shown in FIG. 8). For purposes of illustration, the purge gas channel 286 is illustrated with arrows showing the flow path of purge gas from the channel 236 (as best shown in FIG. 9) to the backside purge gap 285.

Figure 10:
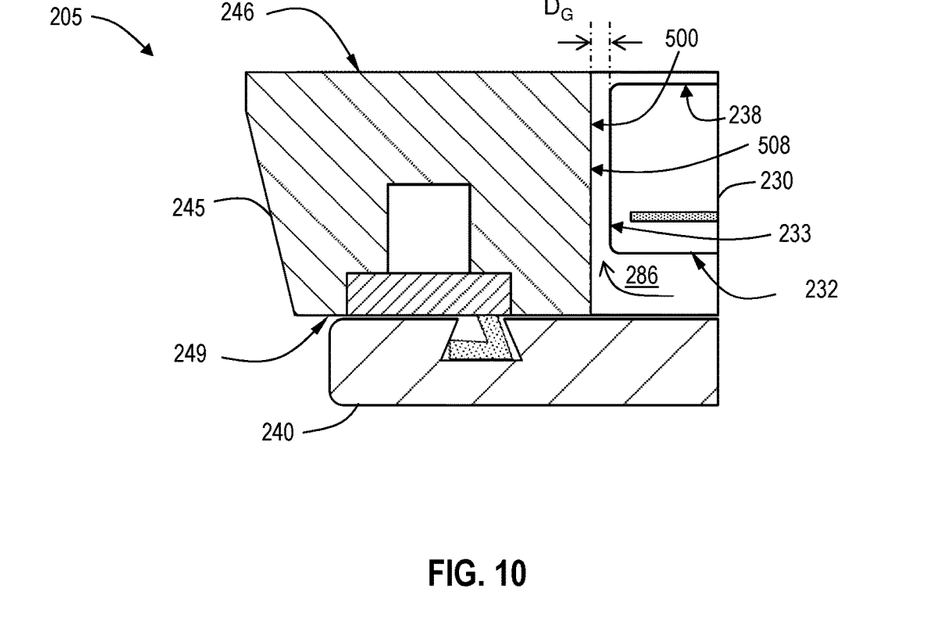
FIG. 10 shows a detailed cross-sectional view of a heater assembly in accordance with one or more embodiments of the disclosure.

FIG. 10 illustrates a cross-sectional view taken along the line 8-8' of FIG. 7 of an embodiment of a heater assembly 205 with emphasis on the top plate wall 500 and the heater wall 233. In the present embodiment, the top plate wall 500 has a flat surface at a right angle relative to the top surface 246 of the top plate 245. As shown the purge gas channel 286 has a width $D_G$ defined by the distance between the top plate wall 500 and the heater wall 233. In some embodiments, increasing the width $D_G$ causes the backside purge pressure to increase and reduces thermal non-uniformity across the substrate and pedestal. However, in some embodiments, increasing the backside purge gas pressure generally, or from the backside purge gas source, increases thermal non-uniformity along the substrate and pedestal.

Figure 11A:
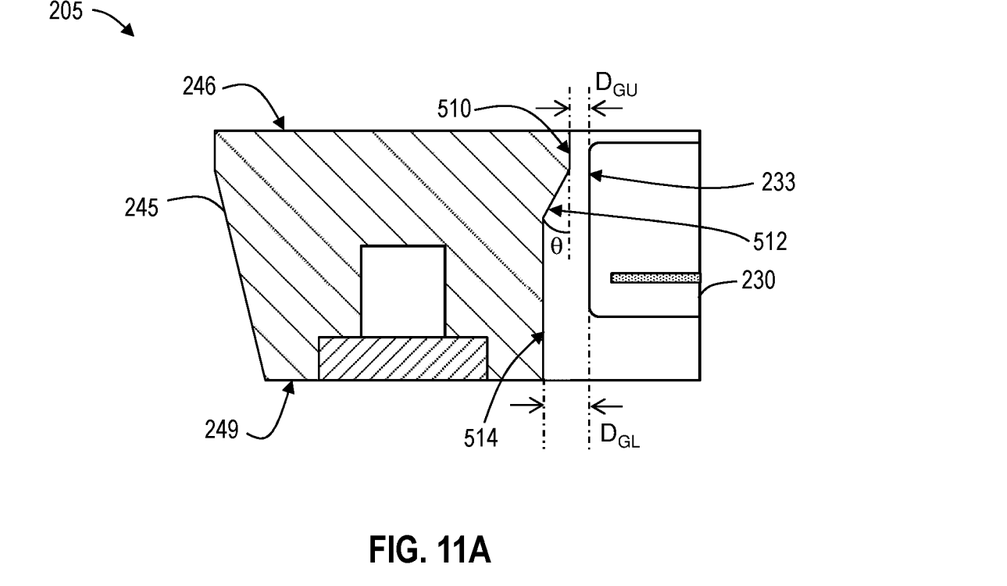
FIG. 11A shows a detailed cross-sectional view of a heater assembly in accordance with one or more embodiments of the disclosure.
Figure 11B:
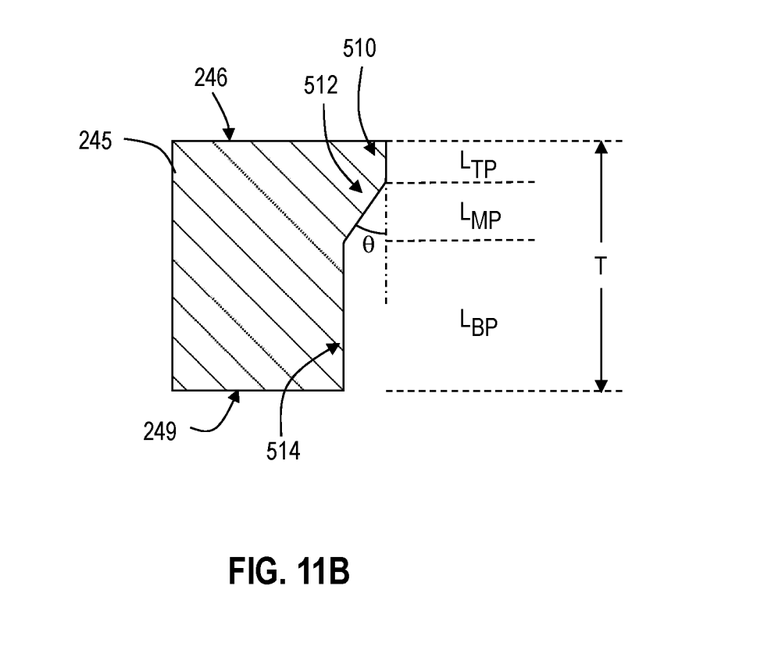
FIG. 11B shows a detailed cross-sectional view of a heater assembly in accordance with one or more embodiments of the disclosure.

FIGS. 11A and 11B illustrate partial cross-sectional views along the line 8-8' of FIG. 7 of an embodiment of a heater assembly 205 with emphasis on the top plate wall 500 and the heater wall 233. FIG. 11A illustrates an assembled view of the heater assembly 205 and FIG. 11B illustrates a partial view of the top plate 245. In the illustrated embodiment, the top plate wall 500 comprises an upper portion 510, a middle portion 512 and a lower portion 514. The upper portion 510 is flat and at a right angle relative to the top surface 246 of the top plate 245, the middle portion 512 is angled relative to the upper portion 510 and the bottom portion 514 is at a right angle relative to the bottom surface 249 of the top plate 245.

In some embodiments, the middle portion 512 of the top plate wall 500 is inclined at an angle $\Theta$ relative to the top portion 510. In some embodiments, the angle $\Theta$ in the range of 10 degrees to 30 degrees, or in the range of 15 degrees to 25 degrees. In some embodiments, the angle is greater than zero and up to 30 degrees. Due to the inclined middle portion 512, the width $D_G$ of the purge gas channel 286 varies between the upper portion 510, the middle portion 512 and the lower portion 514. In particular, the upper portion 510 has a purge gas channel 286 width $D_{GU}$ in which the purge gas channel 286 is narrowest relative to the middle portion 512 and the lower portion 514. Likewise, the lower portion 514 has a purge gas channel 286 width $D_{GL}$ greater than the upper portion 510 and the lower portion 514.

The relative lengths of the top portion 510, middle portion 512 and bottom portion 514 can be varied to change flow characteristics. In some embodiments, a length $L_{TP}$ of the top portion 510, measured from the top surface 246 of the top plate 245, is in the range of 1 mm to 10 mm, or in the range of 1% to 50% of the total thickness T of the top plate 245. In some embodiments, the length $L_{MP}$ of the middle portion 512, measured from the end of the top portion 510 to the end of the bottom portion 514 is in the range of 1 mm to 10 mm, or in the range of 1% to 50% of the total thickness T of the top plate 245. In some embodiments, the length $L_{BP}$ of the bottom portion 514, measured from the bottom surface 249 of the top plate 245, is in the range of 1% to 50% of the total thickness T of the top plate 245. The top plate 245 of some embodiments has a thickness T in the range of 10 mm to 75 mm, or in the range of 15 mm to 60 mm, or in the range of 20 mm to 40 mm.

In some embodiments, there are more than or less than three portions to the top plate wall 500. For example, in some embodiments, there are two portions, a top portion and a bottom portion. The slope or angle between the two portions can be any suitable angle and the length of the top portion and bottom portion can be any suitable percentage of the total thickness of the top plate 245. In some embodiments, there are four or more portions of the top plate wall 500. Each of the portions of the top plate wall can be any suitable percentage of the thickness T of the top plate 245.

Figure 12:
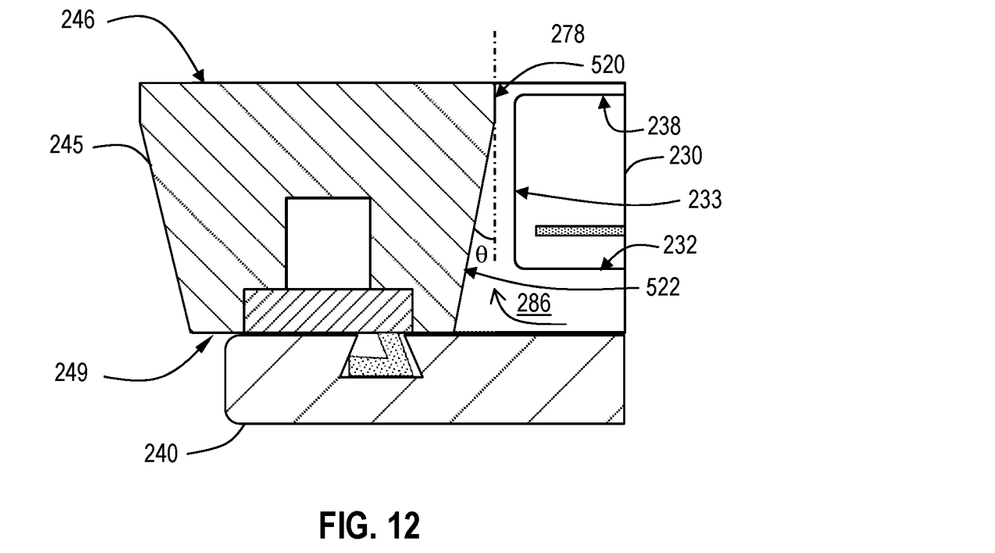
FIG. 12 shows a detailed cross-sectional view of a heater assembly in accordance with one or more embodiments of the disclosure.

FIG. 12 illustrates an alternative embodiment of the top plate wall 500 in which the top plate wall 500 has an upper portion 520 and a lower portion 522 in which the upper portion 520 is flat and at a right angle relative to the top surface 246 of the top plate 245 and the lower portion 522 is angled relative to the upper portion 520. Similar to the embodiment illustrated in FIG. 11A, the lower portion 522 is essentially inclined at an angle $\Theta$ in the range of 20 to 30 degrees. Due to the inclined lower portion 522, the width $D_G$ of the purge gas channel 286 varies between the upper portion 520, and the lower portion 522. In particular, the width $D_G$ is greater between the lower portion 522 and the heater wall 233 relative to the upper portion 520 and the heater wall 233. In some embodiments the angle $\Theta$ is in the range of 20 to 30 degrees. In some embodiments, increasing the angle $\Theta$ causes less variation in temperature across the substrate and thus reduces non-uniformity.

The aforementioned geometric configurations of the top plate wall 500 of FIGS. 11A through 12 allow for the width $D_G$ of the purge gas channel 286 to vary while still maintaining proper backside purge gas pressure. In some embodiments, the width $D_G$ is in the range of 1 mm to 5 mm. Varying the width $D_G$ results in less heater edge loss for smaller widths $D_G$. In some embodiments, a width $D_G$ in the range of 1 mm to 3 mm has less heater edge loss relative to a width $D_G$ in the range of 3 mm to 5 mm. In some embodiments, the width $D_{GL}$ is in the range of 0.1 mm to 3 mm. In some embodiments, the width $D_{GL}$ is up to 5 mm.

Figure 13:
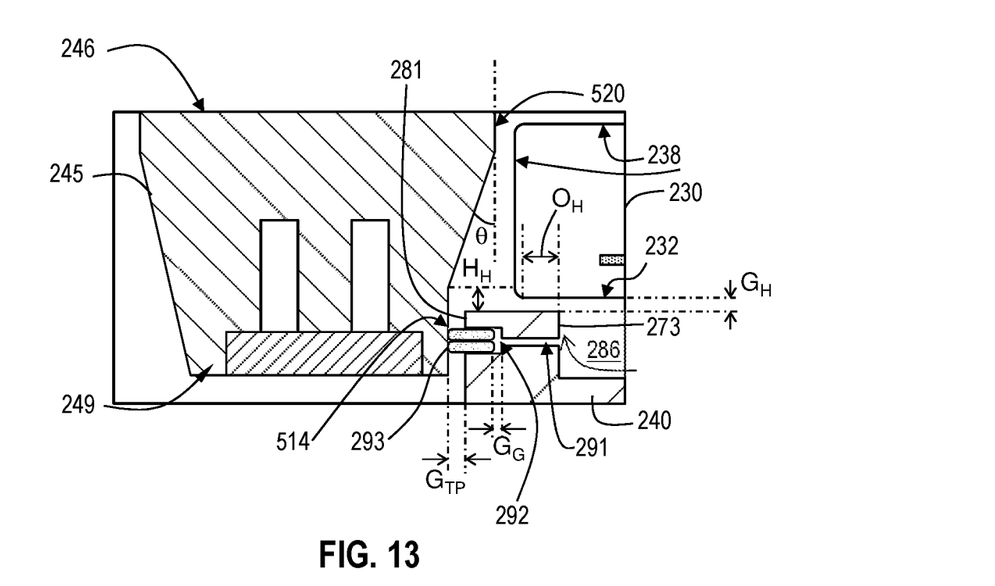
FIG. 13 shows a detailed cross-sectional view of a heater assembly in accordance with one or more embodiments of the disclosure.

As shown in FIG. 13, in some embodiments, the top portion 273 of the shield plate 240 comprises a plurality of holes 291 extending through the top portion 273 to the outer peripheral edge 281. The plurality of holes 291 are positioned radially around the top portion 273. There can be any suitable number of holes 291 with any suitable size. In some embodiments there are in the range of two to 96 holes, or in the range of 3 to 72 holes, or in the range of 4 to 54 holes, or in the range of 5 to 48 holes, or in the range of 6 to 36 holes, or in the range of 7 to 24 holes, or in the range of 8 to 16 holes. In some embodiments, the holes 291 have a diameter in the range of 0.1 mm to 3 mm, or in the range of 0.5 mm to 2 mm, or 1 mm.

In some embodiments, the top portion 273 further comprises a ring-shaped groove 292 positioned on the outer peripheral edge 281 of the shield plate 240. Positioned within the groove 292 are one or more sealing elements to provide a fluid-tight connection between the shield plate 240 and the top plate 245. In some embodiments, the sealing element comprises one or more split rings 293 which contact the lower portion 514 of the top plate wall 500.

In some embodiments, the sealing elements are sized to form a groove 292 within the inner diameter of the sealing element. The groove 292 has a width such that a gap $G_G$ between an inside surface and the inner diameter of the one or more split rings 293 is less than or equal to 4 mm, 3 mm, 2 mm or 1 mm. In some embodiments the groove has a gap $G_G$ sufficient to allow for the thermal expansion and contraction of the one or more split rings 293.

In some embodiments, the geometries of the flow path are adjusted for better thermal uniformity by increasing or decreasing one or more gaps between components. In some embodiments, a gap $G_{TP}$ is formed between the top plate 245 and the outer peripheral edge 281. In some embodiments, the gap $G_{TP}$ is in the of 0.5 mm to 2 mm, or in the range of 0.75 mm to 1.75 mm, or in the range of 1 mm to 1.5 mm, or 1.25 mm.

In some embodiments, a gap $G_H$ is formed between the heater 230 and the shield plate 240. In some embodiments, the gap $G_H$ is in the range of 0.5 mm to 1.75 mm, or in the range of 0.75 mm to 1.5 mm, or in the range of 1 mm to 1.25 mm.

An overlap OH is defined by the length of which the heater wall 233 overlaps over the top portion 273 of the shield plate 240. The overlap OH can vary by increasing or decreasing the width of the top portion 273 of the shield plate 240, thus increasing or decreasing the distance the flow path travels horizontally across the heater 230. Finally, a height $H_H$ defined by the top surface of the top portion 273 of the shield plate 240 by increasing or decreasing the length $L_{BP}$ as shown in FIG. 11B.

Figure 14:
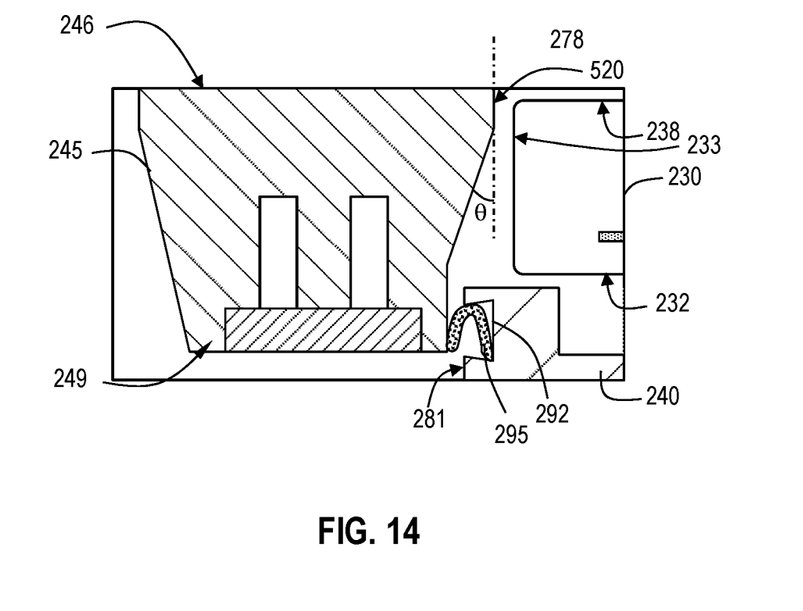
FIG. 14 shows a detailed cross-sectional view of a heater assembly in accordance with one or more embodiments of the disclosure.

In some embodiments, as shown in FIG. 14, the groove 292 can have a dovetail cross-sectional shape such that the groove is wider furthest from the outer peripheral edge 281. In some embodiments, a U-shaped seal ring 295 is positioned within the dovetail groove 292. Upon thermal expansion of the shield plate 240 or the top plate 245, the U-shaped seal ring 295 folds upon itself to maintain a seal where the gap $G_{TP}$ is smaller.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A heater assembly comprising:
    a heater comprising a top surface, a bottom surface and a heater wall extending from the top surface to the bottom surface defining a thickness;
    a top plate having a top surface, a bottom surface defining a top thickness of the top plate, the top plate having at least one opening through the thickness to allow the heater to pass through the opening, the opening having a peripheral inner surface defining a top plate wall extending the thickness of the top plate, the top plate wall comprising an upper portion and a bottom portion, the bottom portion forming an angle Θ relative to the upper portion;
    a shield plate having a top surface, a bottom surface and an outer peripheral edge, the shield plate having an opening extending from the top surface to the bottom surface in an inner portion, the bottom surface of the heater spaced a distance from the top surface of the shield plate, the shield plate having a top portion having a top surface in contact with the bottom surface of the top plate, the top portion of the shield plate has a total thickness $T_{SP}$ defined by the top surface of the top portion of the shield plate to the bottom surface of the shield plate, the top portion having a plurality of holes extending through the top portion to the outer peripheral edge, the top portion having a ring-shaped groove positioned a distance below the top surface of the top portion on the outer peripheral edge of the shield plate; and
    a split ring positioned within the ring-shaped groove of the shield plate.

2. The heater assembly of claim 1, wherein the heater wall is at a right angle relative to the bottom surface and top surface of the heater.

3. The heater assembly of claim 1, wherein a backside purge gap is formed between the heater wall and the top plate wall, the backside purge gap having a width $D_G$.

4. The heater assembly of claim 3, wherein the width $D_G$ is greater between the bottom portion of the top plate and the heater wall relative to the upper portion of the top plate and the heater wall.

5. The heater assembly of claim 1, wherein the width $D_G$ is in the range of 1 mm to 5 mm.

6. The heater assembly of claim 1, wherein angle Θ is in a range of from 10 to 30 degrees.

7. The heater assembly of claim 1, further comprising a heater standoff having a top end and a bottom end, the top end in contact with the bottom surface of the heater.

8. The heater assembly of claim 7, further comprising a shield shaft having a top end and a bottom end, an inside surface surrounding an open interior region and an outside surface, the heater standoff located within the open interior region and the top end of the heater standoff extending above the top end of the shield shaft.

* * * * *